(12) United States Patent
Noda et al.

(10) Patent No.: US 9,972,970 B2
(45) Date of Patent: May 15, 2018

(54) THERMAL EMISSION SOURCE AND TWO-DIMENSIONAL PHOTONIC CRYSTAL FOR USE IN THE SAME EMISSION SOURCE

(71) Applicant: JAPAN SCIENCE AND TECHNOLOGY AGENCY, Kawaguchi-shi, Saitama (JP)

(72) Inventors: Susumu Noda, Kyoto (JP); Takuya Inoue, Osaka (JP); Takashi Asano, Kyoto (JP); Menaka De Zoysa, Muko (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 0 days. days.

(21) Appl. No.: 15/120,254

(22) PCT Filed: Feb. 24, 2015

(86) PCT No.: PCT/JP2015/055161
§ 371 (c)(1),
(2) Date: Aug. 19, 2016

(87) PCT Pub. No.: WO2015/129668
PCT Pub. Date: Sep. 3, 2015

(65) Prior Publication Data
US 2017/0077675 A1   Mar. 16, 2017

(30) Foreign Application Priority Data

Feb. 28, 2014   (JP) ................................. 2014-039298

(51) Int. Cl.
*H01S 3/04*    (2006.01)
*H01S 3/097*   (2006.01)
(Continued)

(52) U.S. Cl.
CPC ........ *H01S 5/18319* (2013.01); *H01S 5/0207* (2013.01); *H01S 5/02453* (2013.01);
(Continued)

(58) Field of Classification Search
CPC ............. H01S 5/18319; H01S 5/18316; H01S 5/3402; H01S 5/0425; H01S 5/0421;
(Continued)

(56) References Cited

U.S. PATENT DOCUMENTS 6,583,445 B1 * 6/2003 Reedy .................... H01L 31/101
257/80
2003/0141507 A1 * 7/2003 Krames .................... H01L 33/08
257/79

(Continued)

FOREIGN PATENT DOCUMENTS

JP   S63-168071 A   7/1988
JP   2968255 B1    10/1999
(Continued)

OTHER PUBLICATIONS

Feb. 13, 2017 Extended Search Report issued in European Patent Application No. 15754718.3.
(Continued)

*Primary Examiner* — Yuanda Zhang
(74) *Attorney, Agent, or Firm* — Oliff PLC

(57) ABSTRACT

A thermal emission source capable of switching the intensity of light at a high response speed similarly to a photoelectric conversion element. A thermal emission source includes: a two-dimensional photonic crystal including a slab in which an n-layer made of an n-type semiconductor, a quantum well structure layer having a quantum well structure, and a p-layer made of a p-type semiconductor are stacked in the mentioned order in the thickness direction, wherein modified refractive index areas (air holes) whose refractive index (Continued)

differs from the refractive indices of the n-layer, the p-layer and the quantum well structure layer are cyclically arranged in the slab so as to resonate with a specific wavelength of light corresponding to a transition energy between the sub-bands in a quantum well in the quantum well structure layer; and a p-type electrode and an n-type electrode for applying, to the slab, a voltage which is negative on the side of the p-layer and positive on the side of the n-layer.

10 Claims, 13 Drawing Sheets

(51) Int. Cl.
| | | |
|---|---|---|
| *H01S 5/183* | (2006.01) | |
| *H01S 5/02* | (2006.01) | |
| *H01S 5/024* | (2006.01) | |
| *H01S 5/10* | (2006.01) | |
| *H01S 5/34* | (2006.01) | |
| *H01S 5/00* | (2006.01) | |
| *H01S 5/042* | (2006.01) | |
| *H01S 5/30* | (2006.01) | |

(52) U.S. Cl.
CPC .......... *H01S 5/0421* (2013.01); *H01S 5/0425* (2013.01); *H01S 5/105* (2013.01); *H01S 5/18316* (2013.01); *H01S 5/3402* (2013.01); *H01S 5/3419* (2013.01); *H01S 5/0014* (2013.01); *H01S 5/02461* (2013.01); *H01S 5/0422* (2013.01); *H01S 5/0428* (2013.01); *H01S 5/309* (2013.01); *H01S 5/3086* (2013.01); *H01S 2302/02* (2013.01)

(58) Field of Classification Search
CPC .. H01S 5/3419; H01S 5/0207; H01S 5/02453; H01S 5/105; H01S 5/309; H01S 5/3086; H01S 2302/02; H01S 5/0428; H01S 5/0422; H01S 5/02461; H01S 5/0014
See application file for complete search history.

(56) References Cited

U.S. PATENT DOCUMENTS

| | | | | |
|---|---|---|---|---|
| 2004/0135155 | A1* | 7/2004 | Otsuka | H01S 5/187 257/79 |
| 2004/0206972 | A1* | 10/2004 | Erchak | H01L 33/10 257/98 |
| 2005/0029536 | A1* | 2/2005 | Sugitatsu | B82Y 20/00 257/103 |
| 2008/0259981 | A1* | 10/2008 | Wang | B82Y 20/00 372/44.01 |
| 2009/0071529 | A1 | 3/2009 | Barker et al. | |
| 2010/0104250 | A1 | 4/2010 | Noda et al. | |
| 2014/0050241 | A1 | 2/2014 | Dallesasse et al. | |

FOREIGN PATENT DOCUMENTS

| | | |
|---|---|---|
| JP | 2005-208470 A | 8/2005 |
| JP | 2008-053134 A | 3/2008 |
| JP | 2008-241891 A | 10/2008 |
| JP | 2009-231773 A | 10/2009 |
| WO | 2008/117533 A1 | 10/2008 |
| WO | 2009/036154 A1 | 3/2009 |

OTHER PUBLICATIONS

Inoue et al, "Realization of dynamic thermal emission control," Nature Materials, vol. 13, Oct. 2014, pp. 928-931.
Houel et al, "Two-dimensional photonic crystals for mid-infrared quantum dot intersublevel emission," Physica Status Solidi B, vol. 246, Jan. 2009, pp. 816-819.
De Zoysa, Menaka et al., "Conversion of broadband to narrowband thermal emission through energy recycling", Nature Photonics, Aug. 2012, vol. 6, pp. 535-539.
May 19, 2015 Search Report issued in International Patent Application No. PCT/JP2015/055161.
May 19, 2015 Written Opinion issued in International Patent Application No. PCT/JP2015/055161.

* cited by examiner

Fig. 17A
Fig. 17B
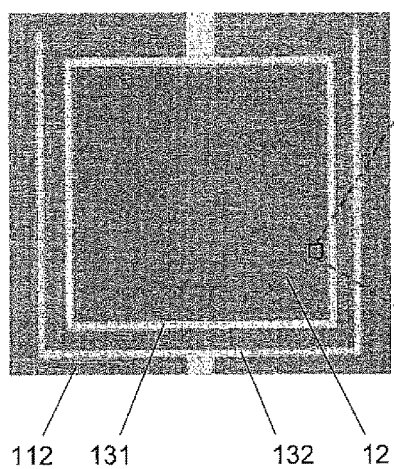
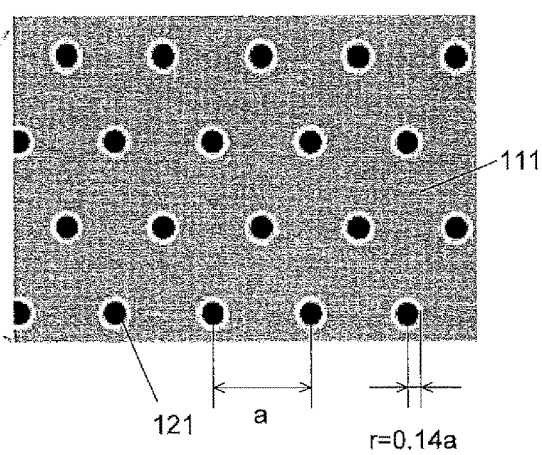
Fig. 17C
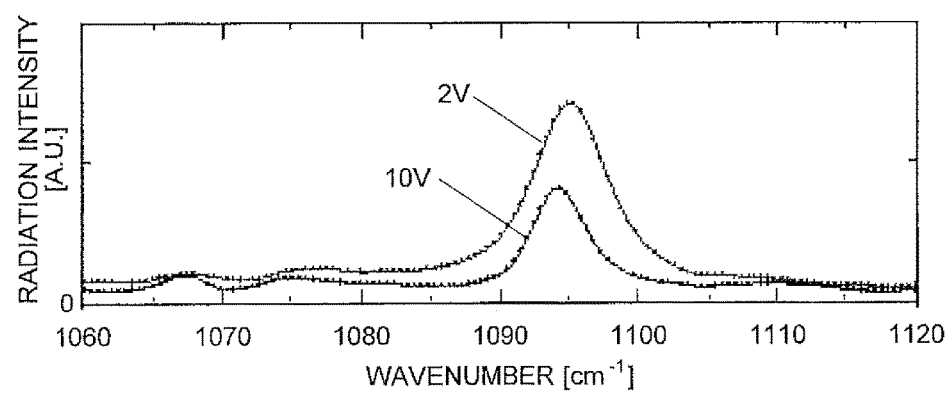

THERMAL EMISSION SOURCE AND TWO-DIMENSIONAL PHOTONIC CRYSTAL FOR USE IN THE SAME EMISSION SOURCE

TECHNICAL FIELD

The present invention relates to a thermal emission source as well as a two-dimensional photonic crystal for use in the same thermal emission source. A thermal emission source is a device in which electromagnetic waves radiated by thermal emission are used as the emission source. This device can also be regarded as a heat-to-light converter which receives heat as the input and generates light (electromagnetic waves) as the output. If this input of heat is imparted in the form of electromagnetic waves (infrared radiation), the device can be regarded as a wavelength converter. It can also be regarded as a device for generating a thermal emission by receiving electric energy as the input instead of heat. The term "thermal emission source" as used in the present application covers any of these devices.

BACKGROUND ART

Thermal emission sources have the advantage that an emission can be obtained by merely imparting heat to an object. For example, in a gas sensor for analyzing the components in an exhaust gas from an engine, the thermal emission source can be suitably used as an emission source for converting waste heat produced by the engine into infrared radiation for the sensing. The application areas of the thermal emission source are not limited to gas sensors; it can also be used as the emission source in various sensors which utilize infrared radiation, such as a sensor for detecting an intrusion of a person, automobile, animal or the like.

Electromagnetic waves emitted from an object which has been given heat have a spectrum which covers a wide range of wavelengths. For example, electromagnetic waves generated by heating an object to a temperature of tens to hundreds of degrees Celsius have a wavelength range of a few μm to several tens of μm. However, since the aforementioned infrared sensor normally utilizes only a specific wavelength of infrared radiation, using such a thermal emission source causes the measurement target to be irradiated with unnecessary wavelengths of infrared radiation other than the specific wavelength, which produces adverse effects, such as the heating of the measurement target. In the case of generating the thermal emission by supplying electric energy, using an emission source which generates a broadband emission causes the problem of an increase in the power consumption.

To solve such problems, a thermal emission source is proposed in Non Patent Literature 1, which includes a slab having a quantum well structure (which will be described later) and modified refractive index areas cyclically arranged in the slab, with the refractive index of those areas differing from that of the slab. A quantum well structure is the structure of an object in which an energy potential in the form of a well ("quantum well") is created by stacking a plurality of kinds of semiconductor layers with a thickness of approximately a few nm to a dozen nm, with each layer having a different magnitude of energy band gap. The cyclic arrangement of the modified refractive index areas in the slab creates a cyclic distribution of the refractive index. Such an object consisting of a slab in which a cyclic distribution of refractive index is formed is called the "two-dimensional photonic crystal". It is commonly known that a two-dimensional photonic crystal can act as a resonator for light having a specific wavelength corresponding to the lattice constant of the refractive index distribution by enabling the formation of standing waves of that specific wavelength of light.

In the thermal emission source disclosed in Non Patent Literature 1, when the supply of heat from the heat source is initiated, an energy transition occurs between the energy bands formed in the quantum well (for distinction from the energy bands of the semiconductor, those bands are called "subbands"), whereby a range of wavelengths of light within a specific wavelength band are generated. Among the wavelengths of light belonging to this wavelength band, the light having a specific wavelength determined by the lattice constant of the photonic crystal resonates with the photonic crystal. In this manner, the thermal emission source of Non Patent Literature 1 can generate light having a wavelength spectrum which has a narrow peak at that specific wavelength.

CITATION LIST

Non Patent Literature

Non Patent Literature 1: De Zoysa Menaka et al., "Conversion of broadband to narrowband thermal emission through energy recycling", *Nature Photonics*, (United Kingdom of Britain), Nature Publishing Group, Jul. 8, 2012, Vol. 6, pp. 535-539

SUMMARY OF INVENTION

Technical Problem

A measurement with a sensor which uses infrared radiation may be adversely affected by various kinds of noise, such as the noise caused by fluctuations in the ambient temperature or a low-frequency noise of equal to or less than 100 Hz which occurs due to the alternating-current power of the power source or other factors. Accordingly, in this type of sensor, a noise removal process which utilizes intensity modulation is performed in which infrared radiation whose intensity changes at a frequency of approximately 1,000-100,000 Hz (1-100 kHz) is generated from the emission source while noise components are removed in the detector by detecting only the component of infrared radiation whose intensity changes at that frequency. Normally, the intensity modulation is achieved using rectangular waves generated by switching infrared light between two different intensity levels ("high" and "low" or "ON" and "OFF"). If a photoelectric conversion element which directly converts electric power into light (such as a laser diode) is used as the emission source, the infrared radiation having a rectangular waveform with the output of the infrared light repeatedly changed between the "ON" and "OFF" levels can be easily generated by the simple operation of periodically turning the electric power on and off. By comparison, in the case of conventional thermal emission sources, the switching of the intensity of the output light requires either the switching of the injection and blockage of the input heat or the switching of the heating and cooling operations, so that the response speed of the switching is much lower than the photoelectric conversion element. Actually, thermal emission sources are only capable of intensity modulation at a low frequency of approximately 1-100 Hz. Therefore, it is difficult to directly use a thermal emission source in a sensor which utilizes intensity modulation. To this end, an external apparatus for mechanically turning the optical path on and off must be additionally provided.

The problem to be solved by the present invention is to provide a thermal emission source capable of switching the intensity of light at a high response speed similarly to a photoelectric conversion element.

Solution to Problem

The thermal emission source according to the present invention developed for solving the previously described problem includes:

a) a two-dimensional photonic crystal including a slab in which an n-layer made of an n-type semiconductor, a quantum well structure layer having a quantum well structure, and a p-layer made of a p-type semiconductor are stacked in the mentioned order in the thickness direction, wherein modified refractive index areas whose refractive index differs from the refractive indices of the n-layer, the p-layer and the quantum well structure layer are cyclically arranged in the slab so as to resonate with a specific wavelength of light corresponding to a transition energy between the subbands in a quantum well in the quantum well structure layer; and b) electrodes for applying, to the slab, a voltage which is negative on the side of the p-layer and positive on the side of the n-layer.

An operation of the thermal emission source according to the present invention is described using FIGS. 1A-2B. Quantum wells are categorized into two groups depending on the type of semiconductor which forms the quantum well structure: the n-type quantum well, which confines electrons in the conduction band, and the p-type well, which confines holes in the valence band.

Initially, the case where the quantum well structure layer is an n-type quantum well structure layer having n-type quantum wells is described using FIGS. 1A and 1B. In the slab composed of the n-layer, n-type quantum well structure layer and p-layer stacked in the mentioned order in the thickness direction, an energy state as shown in FIG. 1A is formed when no voltage is applied. In this energy state, the conduction band and valence band are formed above and below the Fermi level (for electrons) which is common to all layers, with electrons held in the conduction band in the n-layer and holes in the valence band in the p-layer. In the quantum well structure layer, quantum wells are formed in the conduction band, with electrons confined in those quantum wells. A plurality of quantized energy levels (subbands) are formed in each quantum well. When the two-dimensional photonic crystal is heated, the electrons in the quantum wells are excited from one subband to another by the thermal energy and then return to the ground state ("intersubband transition"), generating light having a wavelength corresponding to the energy difference between the ground state and excited state. The intersubband transition occurs with a certain bandwidth. Within this band, a component of light having the specific wavelength corresponding to the lattice constant of the modified refractive index areas forms standing waves in the two-dimensional photonic crystal and resonates with the same crystal. Consequently, this specific wavelength of light is emitted from the thermal emission source to the outside.

Next, when a voltage which is negative on the p-layer and positive on the n-layer is applied through the electrodes to the slab, the energy level of the valence band in the p-layer as viewed from the energy bands in the n-layer becomes higher, as shown in FIG. 1B, and some of the electrons which have been held in the quantum wells in the quantum well structure layer move into the n-layer. Consequently, the amount of electrons in the quantum wells decreases, which also means a decrease in the amount of electrons contributing to the intersubband transition which occurs when the two-dimensional photonic crystal is heated. This leads to a decrease in the intensity of the light generated by the intersubband transition and consequently lowers the intensity of the specific wavelength of light resonating with the two-dimensional photonic crystal and being emitted to the outside.

In this manner, in the thermal emission source according to the present invention, the intensity of light changes with the switching of the applied voltage; the intensity is at the "high" level when the voltage is not applied, while it turns to the "low" level when the voltage is applied. Such a voltage-switching operation can be performed at a much higher rate than the rate of temperature change achieved by the switching of the injection and blockage of heat or the switching of the heating and cooling operations. Furthermore, the change in the number of electrons in the quantum wells almost immediately follows the voltage-switching operation. Accordingly, the switching of the intensity of light in the thermal emission source according to the present invention can be performed at a high response speed as in the photoelectric conversion element.

In the case where the quantum well structure layer is a p-type quantum well structure layer having p-type quantum wells, as shown in FIGS. 2A and 2B, the quantum wells are formed in the valence band, with holes confined in those quantum wells. Heating this two-dimensional photonic crystal causes an intersubband transition of the holes in the quantum wells. The subsequent processes occur in the same manner as in the n-type quantum well structure layer; i.e., the intersubband transition produces an emission of light having a certain wavelength bandwidth, and the specific aforementioned wavelength of light within this band resonates in the two-dimensional photonic crystal to be eventually emitted from the thermal emission source to the outside.

Then, when a voltage which is negative on the p-layer and positive on the n-layer is applied through the electrodes to the slab, the energy level of the conduction band in the p-layer as viewed from the energy bands in the p-layer becomes lower, as shown in FIG. 2B, and some of the holes which have been held in the quantum wells in the quantum well structure layer move into the p-layer. Consequently, the amount of holes in the quantum wells decreases, which also means a decrease in the amount of holes contributing to the intersubband transition in the heating process. This leads to a decrease in the intensity of the light generated by the intersubband transition and consequently lowers the intensity of the specific wavelength of light resonating with the two-dimensional photonic crystal and being emitted to the outside.

The thermal emission source according to the present invention may include an i-layer made of an insulating material between the quantum well structure layer and the p-layer in the case where the quantum well structure layer has an n-type quantum well, or between the quantum well structure layer and the n-layer in the case where the quantum well structure layer has a p-type quantum well. As will be described hereinafter, the i-layer, due to its thickness, reduces the electrical capacitance C of the thermal emission source and thereby contributes to an increase in the operation speed (frequency).

In the thermal emission source according to the present invention, the upper limit of the operation speed is determined by the delay time required for the externally applied voltage to actually act on the quantum well; specifically, the upper limit of the frequency is given by the reciprocal of the product of the electric resistance R and capacitance C of the two-dimensional photonic crystal, $1/(2\pi RC)$. This upper limit of the frequency corresponds to the frequency where the ON/OFF ratio of the intensity of light is −3 dB. Therefore, the two-dimensional photonic crystal should preferably have an electric resistance R and capacitance C with which $1/(2\pi RC)$ becomes equal to or higher than the desired frequency. The electric resistance R can be controlled by the densities of the holes and electrons added in the p-layer and n-layer, respectively. The electric capacitance C can be controlled by the thickness of each layer. However, in order to avoid affecting the number of holes and electrons, it is preferable to provide the aforementioned i-layer and control the capacitance by the thickness of this layer. It should be noted that adding an excessive amount of electrons and holes may cause thermal emission within unnecessary wavelength bands. The electric resistance R and capacitance C can also be adjusted by the area S of the two-dimensional photonic crystal. The smaller the area S is, the lower the electric resistance R and capacitance C become, with the consequent increase in the upper limit of the frequency. By appropriately setting the electric resistance R and capacitance C, a thermal emission source having an operation frequency of 1-100 kHz, which is suitable as the emission source for the previously described sensor, can be realized. It is also possible to realize a thermal emission source having an operation frequency of 10-50 MHz, which can be used in a signal source for free-space communication which is unaffected by the condition of the atmosphere.

In the thermal emission source according to the present invention, it is preferable that, among the p-layer and the n-layer, the layer having a larger effective mass of the carrier (the hole in the p-layer or the electron in the n-layer) has a higher level of carrier density than the layer having a smaller effective mass of the carrier. Under the same carrier density, a carrier having a larger effective mass normally shows a higher resistance. Therefore, the effect of increasing the operation frequency by decreasing the electric resistance R of the two-dimensional photonic crystal will be more noticeably achieved by modifying the density of the carrier having a larger effective mass. Another advantage exists in that modifying the density of the carrier having a larger effective mass is less likely to cause unnecessary thermal emissions.

In the thermal emission source according to the present invention, it is preferable to use, as the electrodes, a metallic p-electrode which is in contact with the p-layer and forms an ohmic junction with the p-type semiconductor constituting the p-layer as well as a metallic n-electrode which is in contact with the n-layer and forms an ohmic junction with the n-type semiconductor constituting the n-layer. An ohmic junction is a junction at which a conduction state similar to the electric conduction which obeys Ohm's law is created without causing a rectifying action between the semiconductor and the metal, as opposed to the Schottky junction which causes a rectifying action.

In the thermal emission source according to the present invention, it is preferable to provide the electrodes on at least one of the surfaces of the slab in such a manner that the electrodes surround an arrangement region where the modified refractive index areas are cyclically arranged. This allows the light to be extracted from the arrangement region without being blocked by the electrodes.

The thermal emission source according to the present invention may further include a heating device for heating the two-dimensional photonic crystal by electric power. Examples of this heating device include a device which passes an electric current through the aforementioned electrodes to the n-layer and/or the p-layer, a device which performs a similar heating process using a dedicated electrode separately provided for the heating device around the aforementioned electrodes, or a mechanism which passes an electric current through a separately provided high-resistance wire for the heating. It is also possible to use the technique of increasing the temperature of the emission source by placing it in contact with a separate heat source instead of providing a heating device in the emission source itself.

The two-dimensional photonic crystal according to the present invention is a device for use in a thermal emission source, including:

a slab in which an n-layer made of an n-type semiconductor, a quantum well structure layer having a quantum well structure, and a p-layer made of a p-type semiconductor are stacked in the mentioned order in the thickness direction; and modified refractive index areas whose refractive index differs from the refractive indices of the n-layer, the p-layer and the quantum well structure layer, the modified refractive index areas cyclically arranged in the slab so as to resonate with a specific wavelength of light corresponding to a transition energy between the subbands in a quantum well in the quantum well structure layer.

Advantageous Effects of the Invention

According to the present invention, a thermal emission source capable of switching the intensity of light at a high response speed similarly to a photoelectric conversion element can be obtained.

BRIEF DESCRIPTION OF DRAWINGS

FIG. 17A is a microscopic image of a thermal emission source having a smaller air-hole diameter than the example of FIGS. 8A and 8B, FIG. 17B is a magnified microscopic image of the two-dimensional photonic crystal in the same thermal emission source, and FIG. 17C is a graph showing the result of a measurement of the wavelength spectrum of the infrared radiation emitted in the same thermal emission source.

DESCRIPTION OF EMBODIMENTS

An embodiment of the thermal emission source according to the present invention is hereinafter described using FIGS. 3A-18B.

Embodiment (1) Configuration of Thermal Emission Source of Present Embodiment

Figure 3A:
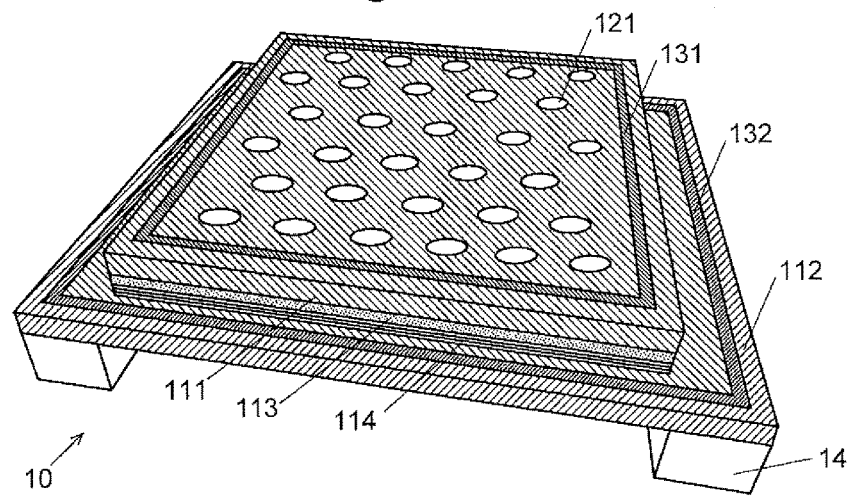
FIGS. 3A, 3B and 3C are a perspective view, vertical sectional view, and top view of a thermal emission source as one embodiment of the present invention, respectively.
Figure 3B:
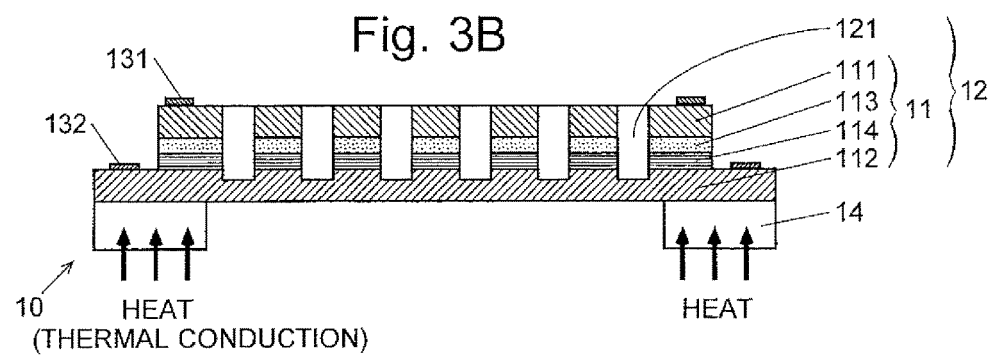
Figure 3C:
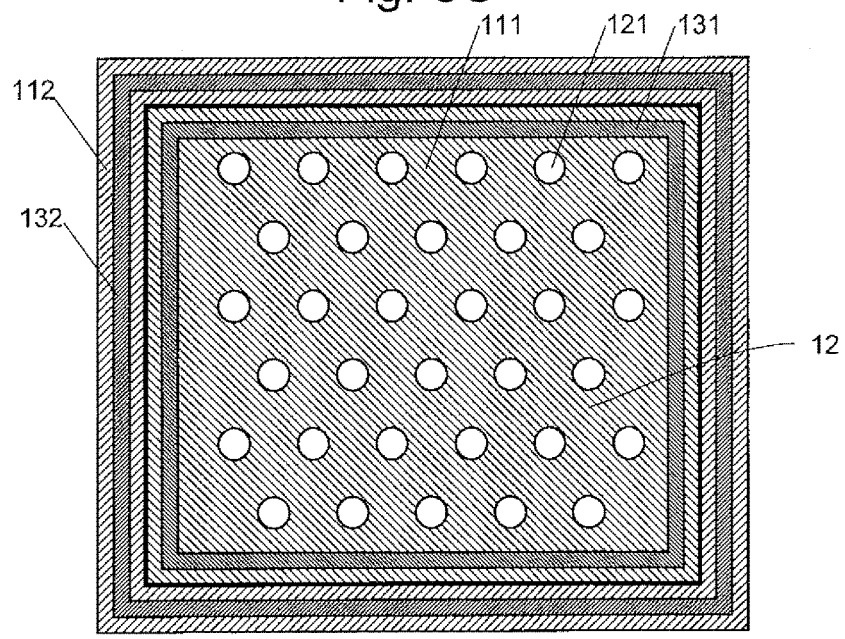

As shown in FIGS. 3A-3C, the thermal emission source 10 of the present embodiment includes a slab 11, air holes 121 (modified refractive index areas) 121, p-type electrode 131, n-type electrode 132 and bases 14. The slab 11 and the air holes 121 form the two-dimensional photonic crystal 12.

The slab 11 is a rectangular laminate structure with a p-layer 111, i-layer 113, quantum well structure layer 114 and n-layer 112 arranged from top to bottom. In the present embodiment, the p-layer 111 and n-layer 112 have a thickness of 800 nm, while the i-layer 113 and quantum well structure layer 114 have a thickness of 200 nm. The material used for the p-layer 111 is p-GaAs, a p-type semiconductor prepared by doping GaAs with Be as the p-type impurity. The material used for the n-layer 112 is n-GaAs, an n-type semiconductor prepared by doping GaAs with Si as the n-type impurity. The material used for the i-layer 113 is GaAs with no dopant implanted. The hole density $N_p$ in the p-layer 111 and the electron density $N_e$ in the n-layer 112 are both $1 \times 10^{17}$ cm$^{-3}$. The quantum well structure layer 114 includes a number of GaAs layers and n-AlGaAs layers alternately arranged in a laminate form. According to this configuration, a number of n-type quantum wells are formed inside the quantum well structure layer 114, with each GaAs layer corresponding to the inner space of the well. An energy potential with a number of quantum wells formed in this manner is called the "multiple quantum wells", and a structure having multiple quantum wells is called the "multiple quantum well structure".

The air holes 121 are arranged in a triangular lattice pattern in the slab 11 within a rectangular region with one side length L=2 mm. The lattice constant a of this triangular lattice is 4.8 µm. Such a cyclic arrangement of the air holes 121 enables the two-dimensional photonic crystal 12 to act as a resonator for an infrared radiation having a wavelength of 9.2 µm in vacuum. The air holes 121 have a columnar shape. This column has a design radius r of approximately 0.96 µm (0.20a) and a thickness of approximately 1.3 µm.

Among the layers constituting the slab 11, the n-layer 112 has a larger area than the other layers and has, at both longitudinal ends, a portion which is not in contact with the quantum well structure layer 114. The n-type electrode 132 is a metallic electrode made of Ge/Au/Ni/Au alloy which forms an ohmic junction with the n-layer 112. This electrode is formed on the aforementioned portion of the n-layer 112 by vapor deposition. The p-type electrode 131 is a metallic electrode made of Au/Zn/Au alloy which forms an ohmic junction with the p-layer 111. This electrode is formed on the surface of the p-layer 111 by vapor deposition. The provision of the p-type and n-type electrodes 131 and 132 at those locations means that a voltage will be applied between the p-layer 111 and the n-layer 112 across the quantum well structure layer 114 and the i-layer 113. Additionally, since the p-type electrode 131 is provided in such a manner as to surround the region where the air holes 121 are cyclically arranged (arrangement region), the light can be extracted from the arrangement region without being blocked by the p-type electrode 131.

The bases 14 are two rectangular-parallelepiped members made of an electrical insulator GaAs with no dopant added. The two bases 14 are attached to the lower surface of the n-layer 112 near the longitudinal ends of the slab 11 and parallel to the shorter side of the same slab 11. By these bases 14, the slab 11 is supported free from contact with other objects except for the portions to which the bases 14 are attached. In the process of heating the thermal emission source 10, the heat is transferred from an external heat source through these bases 14 to the two-dimensional photonic crystal 12 by thermal conduction.

(2) Result of Calculation on Characteristics of Thermal Emission Source 10 in Present Embodiment Next, the results of simulations conducted to calculate the characteristics of the thermal emission source 10 in the present embodiment are described. In the following description, the polarity of the voltage applied between the p-type electrode 131 and the n-type electrode 132 is negative on the p-layer 111 (p-type electrode 131) and positive on the n-layer 112 (n-type electrode 132) unless otherwise stated.

Figure 1A:
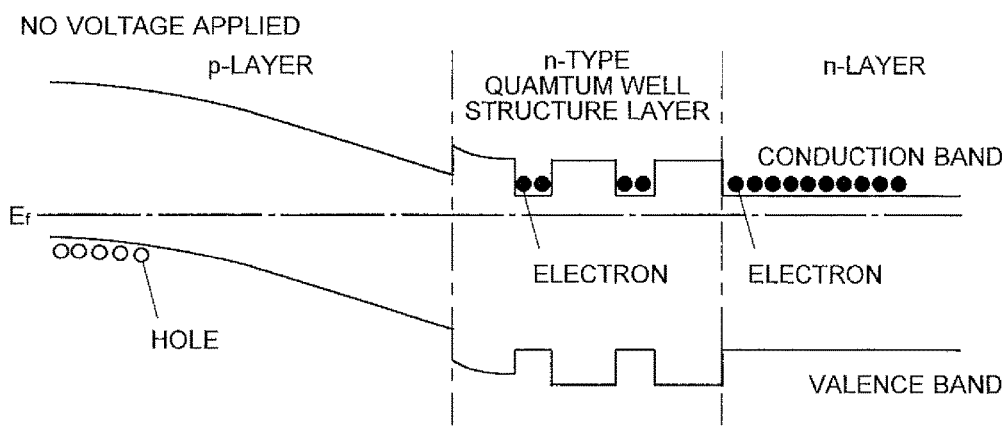
FIGS. 1A and 1B are diagrams for explaining the energy state of the electrons in the thermal emission source according to the present invention in the case where the quantum well structure layer has n-type quantum wells.
Figure 1B:
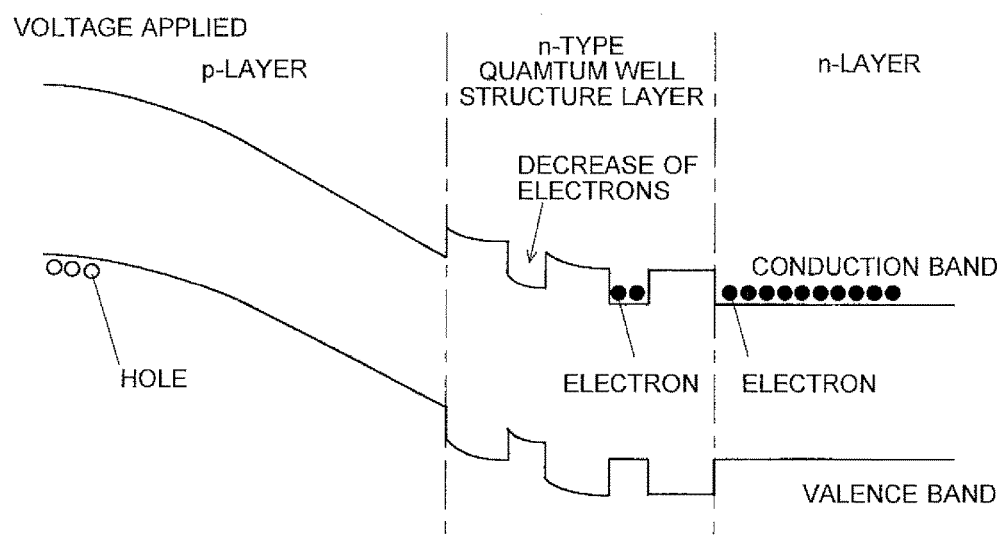
Figure 2A:
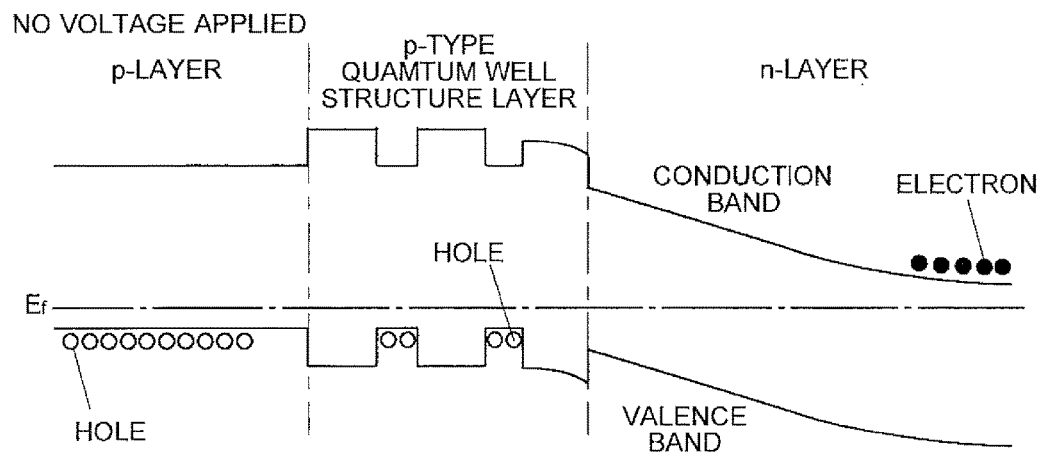
FIGS. 2A and 2B are diagrams for explaining the energy state of the electrons in the thermal emission source according to the present invention in the case where the quantum well structure layer has p-type quantum wells.
Figure 2B:
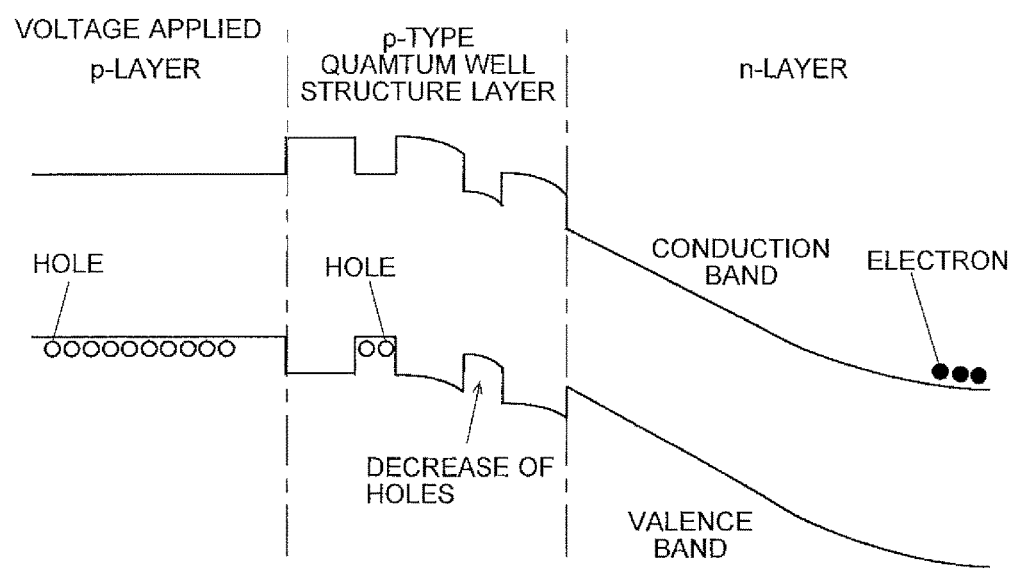
Figure 4:
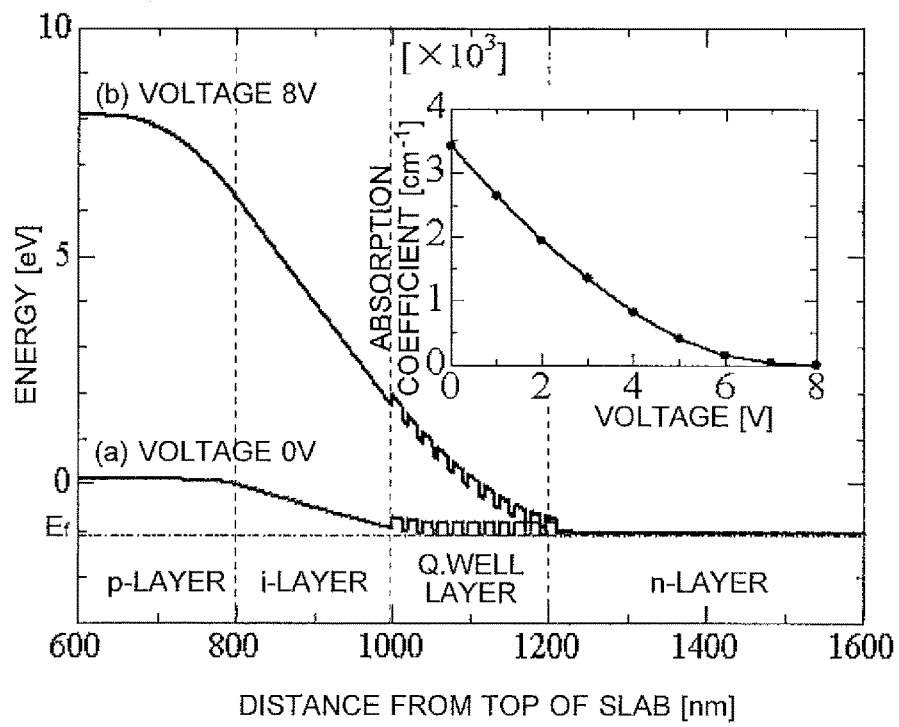
FIG. 4 is a graph showing the result of a calculation of the potential of the electrons for the thermal emission source of the present embodiment in the case where no voltage is applied between the electrodes as well as in the case where a voltage is applied. The inset is a graph showing the result of a calculation of the relationship between the voltage and the absorption coefficient.

Initially, using FIG. 4, the result of a calculation is described in which the potential of the electrons contributing to the thermal emission in the p-layer 111, i-layer 113, quantum well structure layer 114 and n-layer 112 of the thermal emission source 10 was calculated. Two cases were considered in this calculation: (a) no voltage is applied between the p-type electrode 131 and the n-type electrode 132; and (b) a voltage of 8 V is applied between the electrodes. The heating temperature was set at 200° C. In both cases (a) and (b), a number of quantum wells (multiple quantum wells) are formed in the quantum well structure layer 114, as shown in the graph of FIG. 4. In case (a), all quantum wells have almost equal potentials. By comparison, in case (b), the quantum wells located close to the p-layer 111 have generally higher energy levels than those in (a). This means that, when the voltage is applied, no electrons exist in the quantum wells located close to the p-layer 111, so that the amount of electrons which contribute to the thermal emission is smaller than when no voltage is applied (see FIGS. 1A and 1B). Accordingly, when the voltage is applied, the coefficient of optical absorption due to the intersubband transition (ISB-T) in the quantum wells becomes lower than when no voltage is applied (see the inset in FIG. 4), and the emission intensity also becomes lower.

Figure 5:
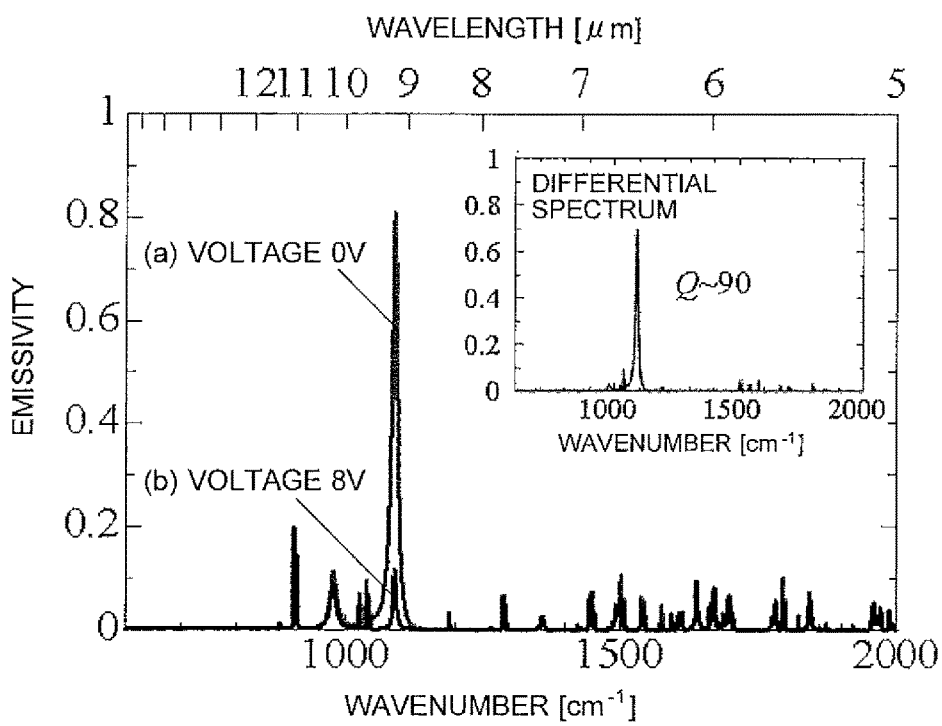
FIG. 5 is a graph showing the result of a calculation of the wavelength spectrum of the emissivity of light for the thermal emission source of the present embodiment in the case where no voltage is applied between the electrodes as well as in the case where a voltage is applied. The inset is a graph demonstrating the difference between the two wavelength spectra.

Next, using FIG. 5, the result of a calculation is described in which the wavelength spectrum of the emissivity of light from the thermal emission source 10 heated to 200° C. with an external heat source was calculated for two cases: (a) no voltage is applied and (b) a voltage of 8V is applied. The emissivity is defined as the emission intensity of the thermal emission source 10 divided by the intensity of the blackbody emission at the same temperature at each wavelength. The wavelength and wavenumber in the graph of FIG. 5 indicate those of light in vacuum. This graph shows that the peak emissivity at a wavelength of 9.2 μm in (b) is approximately one eighth of the value in (a). Although emissivity peaks are also recognized at wavelengths other than 9.2 μm, all of those peak values are sufficiently lower than the peak value at 9.2 μm in (a). Furthermore, none of the peaks except the one at 9.2 μm has a significant difference in the peak value between (a) and (b). This fact is also evident from the graph in the inset in FIG. 5, which shows the difference between (a) and (b). These calculation results mean that only a narrow wavelength band of infrared radiation around 9.2 μm undergoes intensity modulation by the voltage on/off operation. Accordingly, in a sensor which uses this thermal emission source 10, it is possible to selectively obtain a response in a narrow band of infrared radiation around 9.2 μm based on a signal whose intensity has been modulated at the frequency corresponding to the voltage on/off operation among the detected optical signals.

Figure 6A:
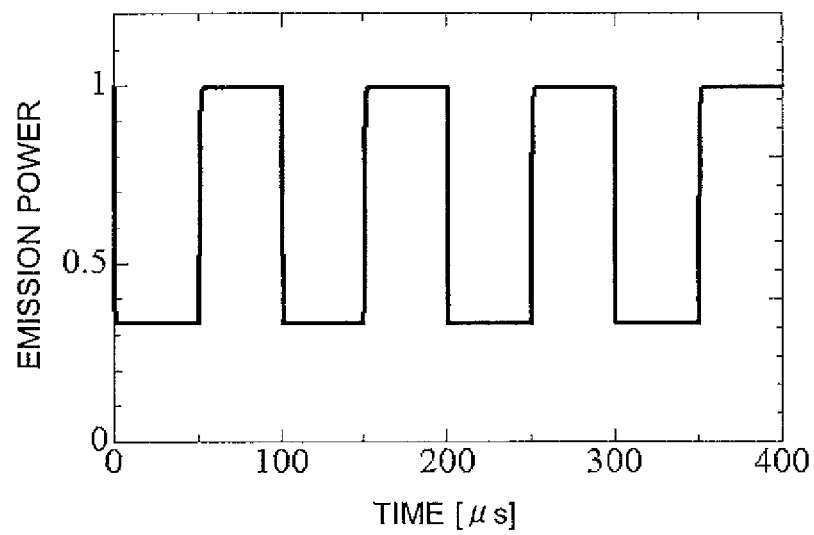
FIG. 6A is a graph showing the result of a calculation of the temporal change in the emission power of the thermal emission source of the present embodiment in which the voltage applied between the electrodes is alternated at a frequency of 10 kHz.
Figure 6B:
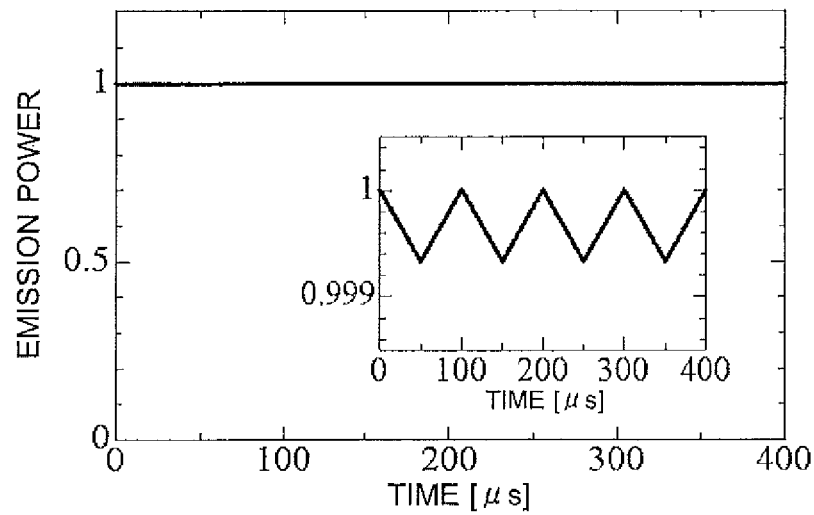
FIG. 6B is a graph showing the result of a corresponding calculation performed for a conventional thermal emission source as a comparative example in which the voltage supplied to a heater for heating the emission source is alternated at a frequency of 10 kHz.

Next, using FIGS. 6A and 6B, the result of a calculation is described which was conducted to investigate the temporal change in the emission power which occurs when the voltage applied between the electrodes is turned on and off while the thermal emission source 10 is heated. The voltage in the "ON" state was set at 8 V, and the on/off frequency (modulation frequency) was set at 10 kHz. The heating temperature was set at 200° C. Taking into account the fact that commonly used infrared detectors detect infrared radiation within a specific wavelength band without resolving it into component wavelengths, the emission power was accumulated over a wavelength band from 5 to 15 μm. As a comparative example, a similar calculation was conducted for a conventional thermal emission source under the condition that the input power supplied to the emission source to change its temperature was turned on and off at a frequency of 10 kHz. The results of these calculations demonstrated that the difference in the emission power (this difference is hereinafter called the "modulation power") between the "ON" and "OFF" periods of the heater in the comparative example (FIG. 6B) was at an extremely low level of 0.066%, whereas the modulation power in the present embodiment (FIG. 6A) was approximately 67%. This means that the device according to the present embodiment can modulate the intensity of light at a high modulation frequency of 10 kHz and with a modulation depth of approximately 1000 times the conventional value. As already noted, the data shown in FIG. 6A are values obtained by accumulating the emission power over a wavelength band from 5 to 15 μm. However, taking into account the spectra in FIG. 5, it is possible to conclude that it is the narrow wavelength range of infrared radiation around 9.2 μm that contributes to the intensity modulation.

Figure 7:
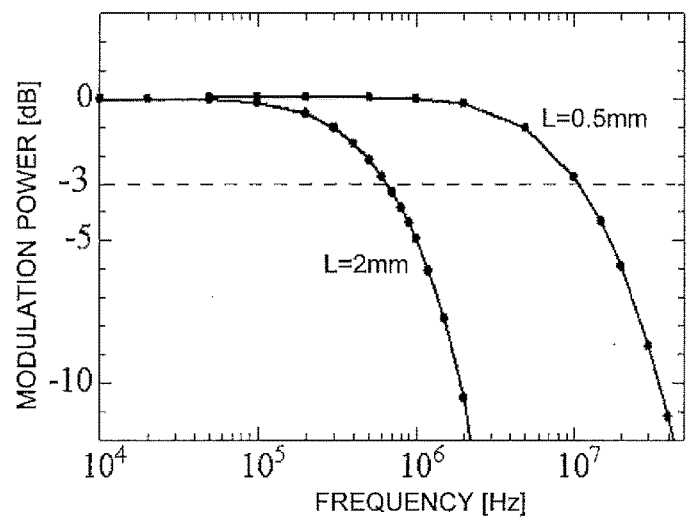
FIG. 7 is a graph showing the result of a calculation in which the change in the modulation power with respect to the modulation frequency was calculated for the thermal emission source of the present embodiment.

Next, using FIG. 7, the result of a calculation is described in which the difference in the emission power between the "OFF" and "ON" periods of the voltage was calculated for various modulation frequencies. The modulation power at each modulation wavelength is expressed by its ratio to the modulation power at a low frequency (100 Hz) in decibels. The calculation was performed for two different forms of the region where the air holes 121 were arranged in the slab 11 (arrangement region): a square region with one side length L=2 mm and a square region with L=0.5 mm. The modulation frequency at which the value on the vertical axis in FIG. 7 becomes −3 dB (i.e. one half of the modulation power recorded when the modulation frequency indicated by the horizontal axis was at 100 Hz) was approximately 700 kHz for L=2 mm and 10 MHz for L=0.5 mm. Accordingly, these thermal emission sources in the present embodiment can perform a definite modulating action even when the modulation frequency is set at higher levels than the conventional maximum value of 100 Hz. A comparison of the two results obtained for L=0.5 mm and L=2 mm indicates that reducing the size of the arrangement region makes higher modulation frequencies available.

(3) Result of Experiments for Thermal Emission Source of Present Embodiment

Figure 8A:
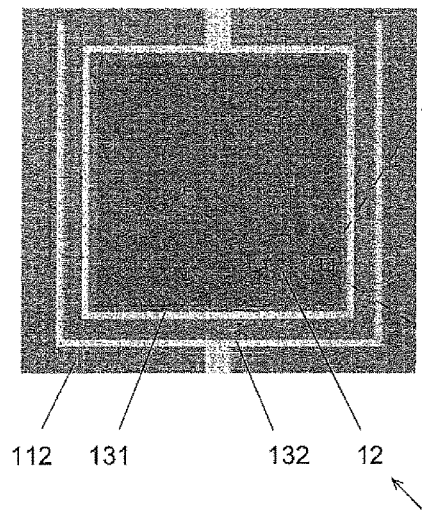
FIG. 8A is a microscopic image of a thermal emission source fabricated in the present embodiment.
Figure 8B:
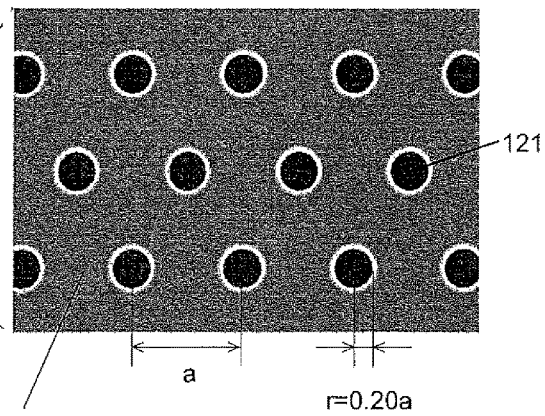
FIG. 8B is a magnified microscopic image of the two-dimensional photonic crystal in the same thermal emission source.

Next, the result of an experiment performed for an actually fabricated thermal emission source (which is hereinafter called the "thermal emission source 10A") is presented. FIGS. 8A and 8B are microscopic images of the thermal emission source 10A taken from the upper side in the perspective view shown in FIG. 3A. Specifically, FIG. 8A is an image showing the entire top surface of the thermal emission source 10A taken with an optical microscope, while FIG. 8B is a magnified image showing a portion of the two-dimensional photonic crystal 12 taken with an electron microscope.

Figure 9:
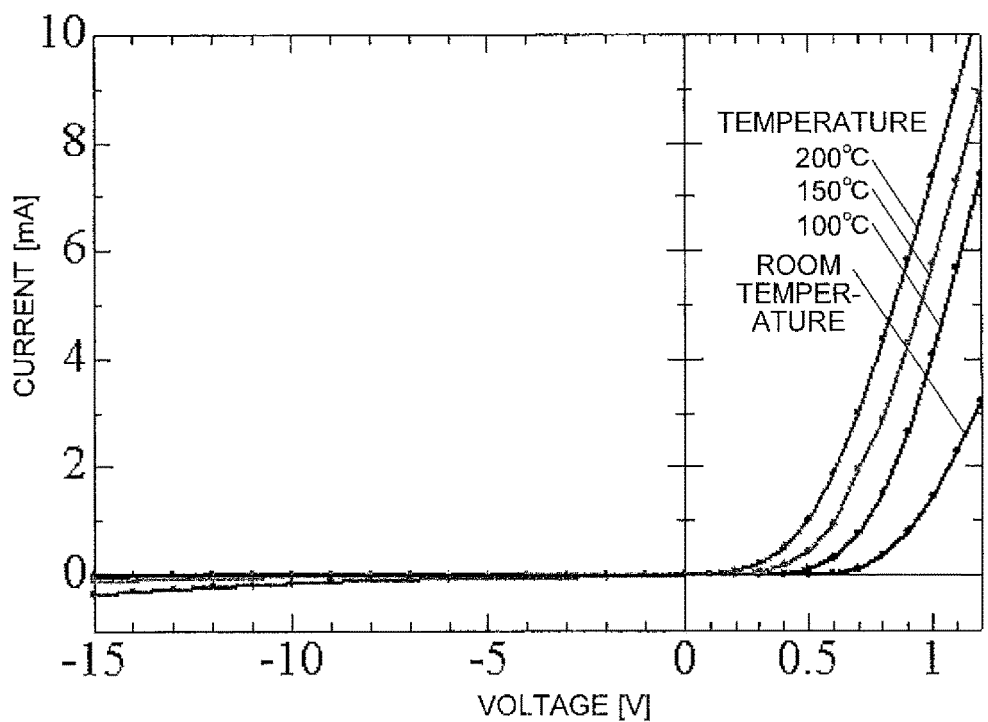
FIG. 9 is a graph showing the result of a measurement in which the current-voltage characteristics of the thermal emission source fabricated in the present embodiment were investigated at a plurality of different temperatures.

FIG. 9 shows the measured result of the current-voltage characteristics for the obtained thermal emission source 10A. In this figure, a voltage which is positive on the p-type electrode 131 and negative on the n-type electrode 132 is expressed by a positive value, as is the common practice for this type of measurement performed for a PIN diode consisting of a p-type semiconductor, insulator and n-type semiconductor sequentially joined. The measurement, which was conducted at a plurality of temperatures from room temperature to 200° C., proved that the obtained thermal emission source 10A exhibited the characteristics as a diode at any of those temperatures; i.e. it allowed electric current to pass through when the voltage was positive, while it barely allowed the passage of the current when the voltage was negative. This result demonstrates that the thermal emission source 10A utilizes the transfer of electrons between the quantum wells and the n-type semiconductor, without allowing the passage of the electric current, when the voltage is within a range from zero to the negative bias voltage in a PIN diode.

Figure 10:
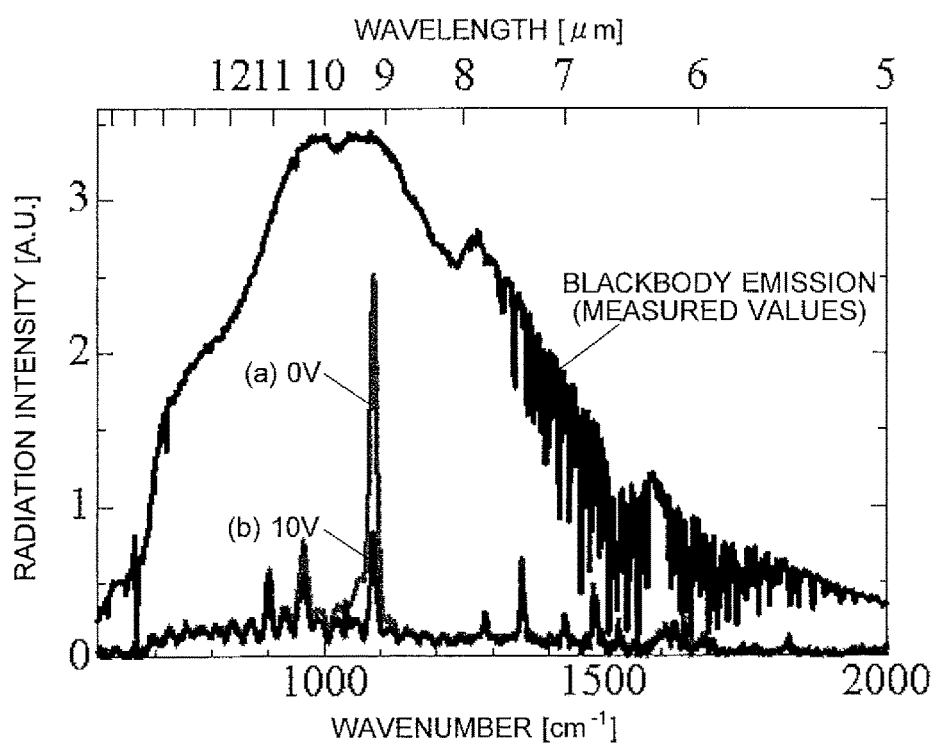
FIG. 10 is a graph showing the result of a measurement of the wavelength spectrum of the infrared radiation emitted from the thermal emission source fabricated in the present embodiment when no voltage was applied between the electrodes as well as when a voltage was applied, along with a measurement result obtained for a blackbody emission source with the same area under the same temperature condition.

FIG. 10 shows the result of an experiment in which the wavelength spectrum of the radiation intensity of the light from the thermal emission source 10A was measured under the condition that the voltage applied between the p-type electrode 131 and the n-type electrode 132 was (a) 0 V or (b) 10 V (which is presented as a negative value in FIG. 9), along with a measurement result obtained for a blackbody emission source with the same area under the same temperature condition. The radiation intensity of the light is represented in arbitrary unit, with the intensities adjusted so that the measurement results for (a), (b) and the blackbody emission source can be compared with each other. Similarly to the calculated result shown in FIG. 5, this experimental result demonstrates that the radiation intensity at the wavelength of 9.2 μm in (b) was dramatically lower than the value in (a), while the emission at the other wavelengths was either unobservable or detected with approximately equal intensities in both (a) and (b).

Figure 11A:
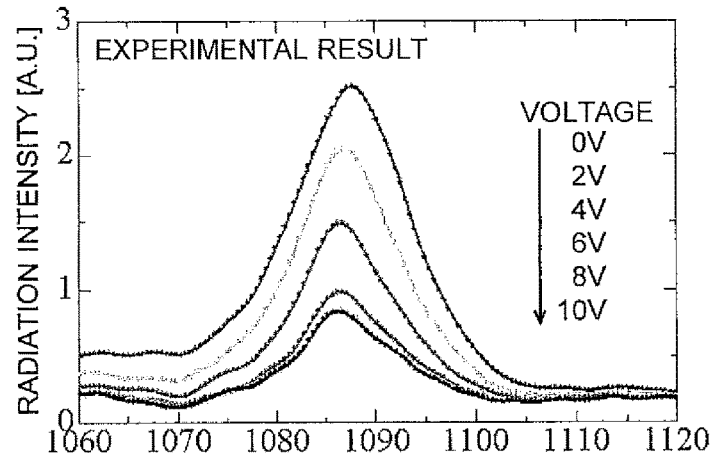
FIG. 11A is a graph showing the wavelength spectrum of the infrared radiation measured for various values of the voltage applied between the electrodes in the thermal emission source fabricated in the present embodiment.
Figure 11B:
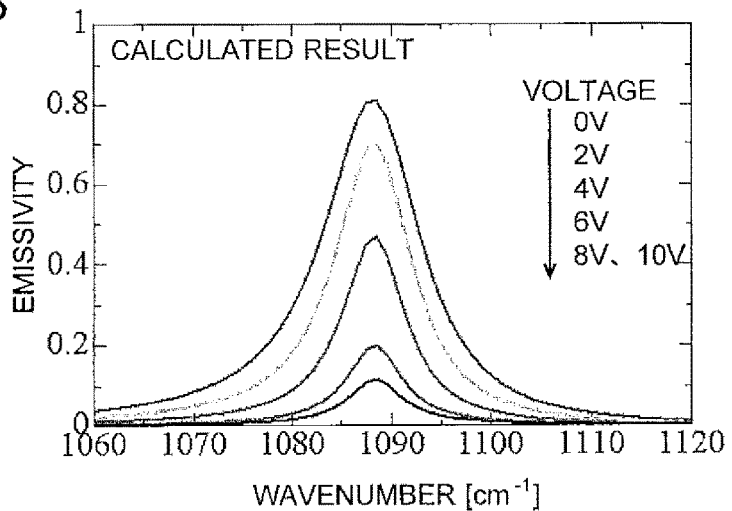
FIG. 11B is a graph showing the wavelength spectrum of the infrared radiation calculated under the conditions corresponding to the present measurement. It should be noted that the data for voltages of 8 V and 10 V in FIG. 11B are shown in an overlapped form.
Figure 12:
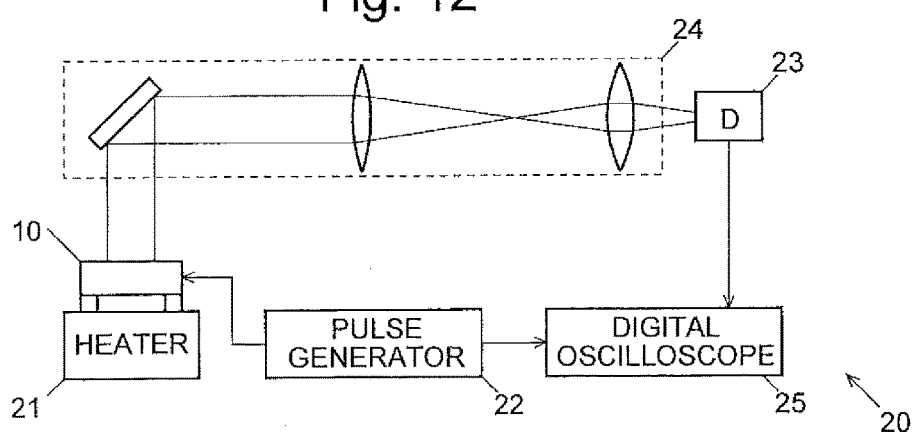
FIG. 12 is a model diagram showing the optical system for a high-speed modulation experiment in which the temporal change in the intensity of the light emitted from the thermal emission source fabricated in the present embodiment is measured while the frequency of the voltage applied between the electrodes is gradually changed within a range from 0.1 kHz to 1.5 MHz (from 100 to 1,500,000 Hz).

FIG. 11A shows the result of a measurement in which the wavelength spectrum around the wavelength of 9.2 μm was measured for a plurality of voltages applied within a range from 0 to 10 V, and FIG. 11B shows the result of a calculation corresponding to this measurement. The measured result is in good agreement with the calculated result at any of the applied voltages.

Next, the result of a measurement is presented in which the intensity of the emission from the thermal emission source 10A was measured while the voltage applied between the p-type electrode 131 and the n-type electrode 132 was repeatedly turned on and off at a modulation frequency equal to or higher than 10 kHz. This measurement was conducted with the experimental system 20 shown in FIG. 12. It should be noted that numeral "10" is used for the thermal emission source in FIG. 12 as well as in the following description in this paragraph, because the experimental system 20 is also used for another thermal emission source 10B (which will be described later). The experimental system 20 includes a heater 21 for supporting and heating the thermal emission source 10, a pulse generator 22 for generating a rectangular radio-frequency voltage with a specified modulation frequency to be applied between the p-type electrode 131 and the n-type electrode 132, a detector 23 for detecting the light emitted from the thermal emission source 10, an optical system 24 for guiding the light from the thermal emission source 10 to the detector 23, and a digital oscilloscope 25 for monitoring the output signal from the detector 23 by synchronizing this signal with the radio-frequency voltage generated by the pulse generator 22. A HgCdTe (mercury cadmium telluride) detector was used as the detector 23. The level of the radio-frequency voltage generated by the pulse generator 22 during the "ON" period was set at 10 V.

Figure 13:
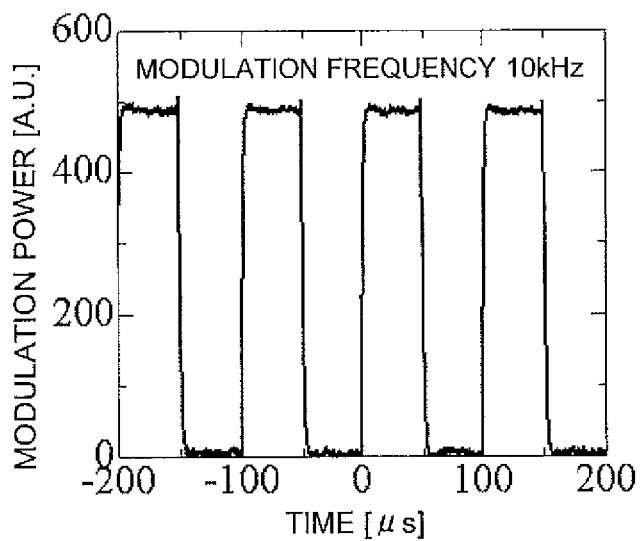
FIG. 13 is a graph showing the result of the high-speed modulation experiment performed at a frequency of 10 kHz for the thermal emission source fabricated in the present embodiment.

FIG. 13 shows the measured result for a modulation frequency of 10 kHz. An output signal having a square waveform corresponding to the frequency of the applied voltage was obtained.

Figure 14:
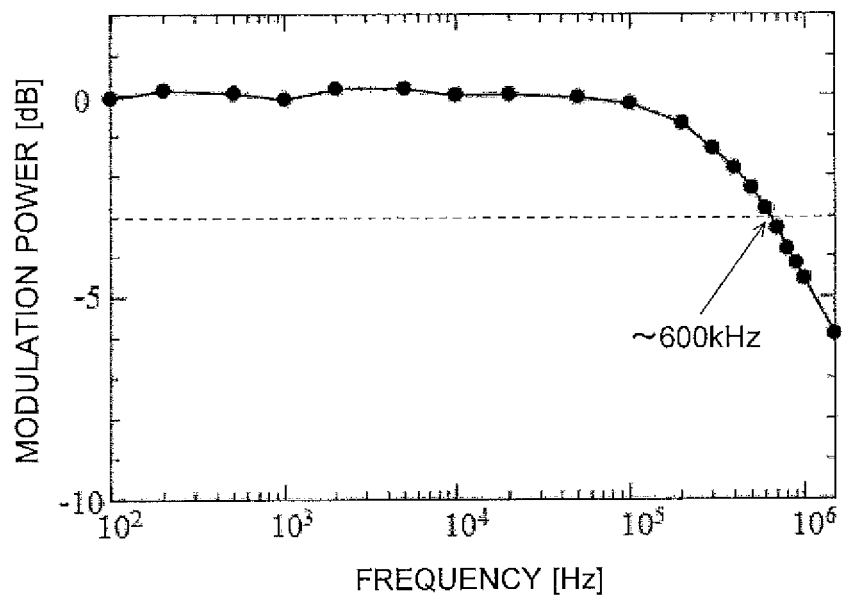
FIG. 14 is a graph showing the result of an experiment in which the change in the modulation power with respect to the modulation frequency was determined for the thermal emission source fabricated in the present embodiment.

FIG. 14 shows the result of a measurement in which the change in the modulation power with respect to the modulation frequency was measured using the experimental system 20. The modulation power was equal to or higher than −3 dB within a frequency range of approximately 600 kHz or lower. This result is in good agreement with the calculate result shown in FIG. 7.

To further increase the modulation frequency, or to achieve an even higher speed of operation, the carrier densities in the p-layer 111 and n-layer 112 as well as the area of the air-hole arrangement region were investigated. The result is hereinafter described.

Figure 15A:
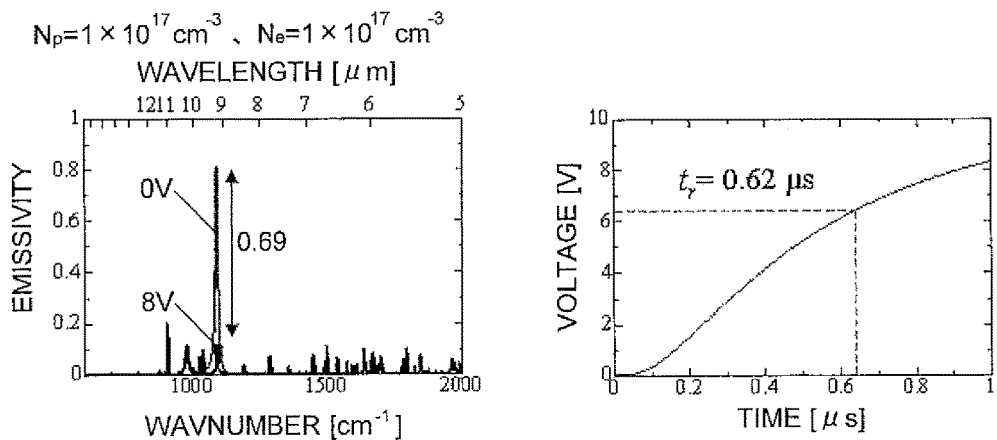
FIGS. 15A-15C are graphs showing the emissivity (left-hand panel) and delay time (right-hand panel) calculated for the thermal emission source of the present embodiment under the following conditions: the hole density $N_p$ in the p-layer and the electron density $N_e$ in the n-layer are both $1 \times 10^{17}$ cm$^{-3}$ (FIG. 15A); $N_p$ and $N_e$ are both $1 \times 10^{18}$ cm$^{-3}$ (FIG. 15B); and $N_p$ is $1 \times 10^{18}$ cm$^{-3}$ while $N_e$ is $1 \times 10^{17}$ cm$^{-3}$ (FIG. 15C).
Figure 15B:
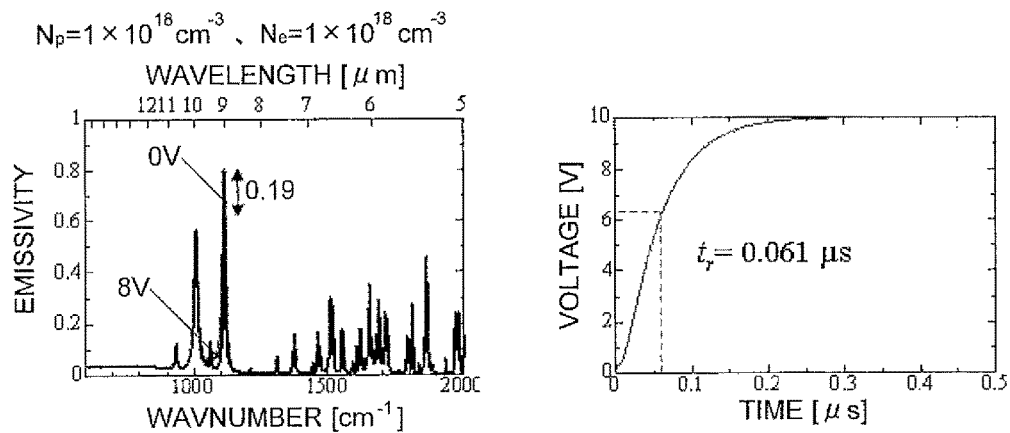
Figure 15C:
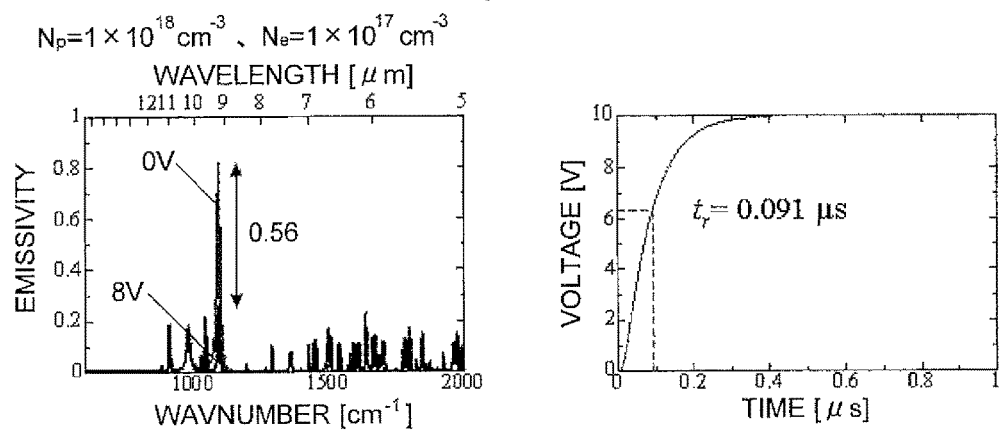

Initially, a description related to the carrier density is given, using FIGS. 15A-15C. FIG. 15A is a graph showing the emissivity (left-hand panel, a reproduction of the graph in FIG. 5, exclusive of the inset) and the delay time tr (right-hand panel) in the case where the hole density $N_p$ in the p-layer 111 and the electron density $N_e$ in the n-layer 112 are both at the value used in the previous embodiment ($1\times10^{17}$ cm$^{-3}$). The delay time tr is the period of time required for the voltage applied between the electrodes to actually act on the quantum wells in the central portion of the photonic crystal. More specifically, in the present case, the delay time tr is defined as the period of time required for the voltage applied to the quantum well structure layer 114 to reach the value equal to ($1-e^{-1}$) times the value which was ultimately recorded after a sufficient amount of time (where e is the base of natural logarithm; $1-e^{-1} \cong 0.63$). The voltage between the p-type electrode 131 and the n-type electrode 132 was 8 V in the left-hand panel and 10 V in the right-hand panel. In the calculation of FIG. 15A, the change in the emissivity between the "OFF" and "ON" periods of the voltage was 0.69. The delay time tr was 0.62 μs.

Next, the hole density $N_p$ in the p-layer 111 and the electron density $N_e$ in the n-layer 112 were both increased to $1\times10^{18}$ cm$^{-3}$. The result was as shown in FIG. 15B, where, as compared to FIG. 15A, the delay time tr was shortened to 0.061 μs and the change in the emissivity between the "OFF" and "ON" periods of the voltage was decreased to 0.19. This means that the device performance improved in terms of the delay time tr but deteriorated in terms of the ON/OFF ratio. Additionally, as can be seen in the left-hand panel in FIG. 15B, unnecessary emissions at wavelengths other than the target wavelength (9.2 μm) increased.

Accordingly, another calculation was performed, in which only the hole density $N_p$ in the p-layer 111 was increased to $1 \times 10^{18}$ cm$^{-3}$ while the electron density $N_e$ in the n-layer 112 was maintained at the original value of $1 \times 10^{17}$ cm$^{-3}$. This means that the density of the holes in the p-layer 111, which have a larger effective mass as the carrier than the electrons in the n-layer 112, was increased. The result was as shown in FIG. 15C, where the delay time tr was shortened from the value in FIG. 15A to 0.091 µs, while the change in the emissivity between the "OFF" and "ON" periods of the voltage was 0.56, which means a better performance in terms of emissivity as compared to FIG. 15B. Unnecessary emissions at wavelengths other than the target wavelength were also lower than in FIG. 15B.

Figure 16:
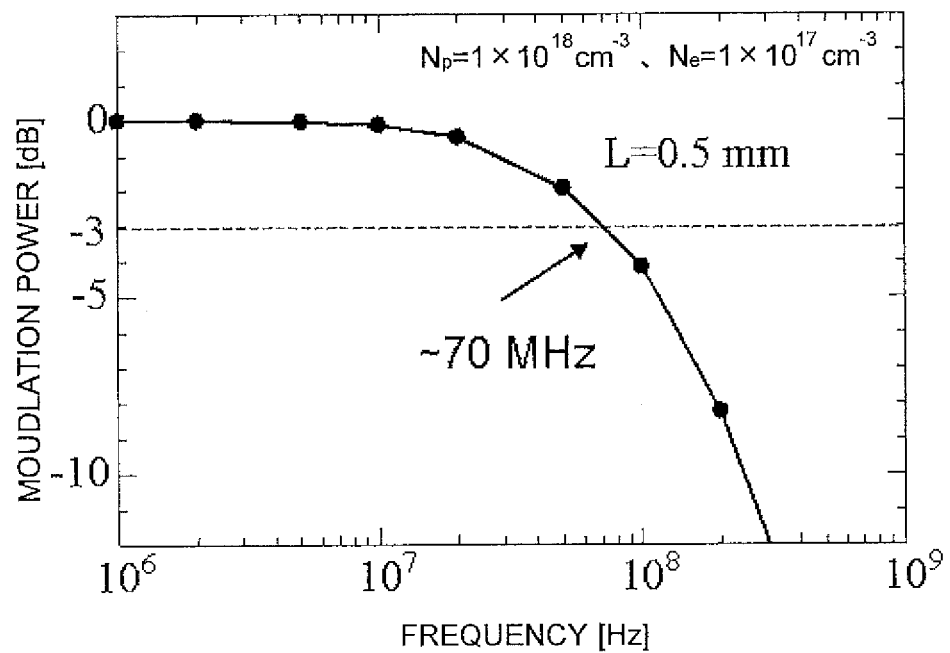
FIG. 16 is a graph showing the result of a calculation in which the change in the modulation power with respect to the modulation frequency was calculated under the condition that the air-hole arrangement region was a 0.5 mm square region.

FIG. 16 shows the result of a calculation in which the change in the modulation power with respect to the modulation frequency was calculated under the condition that the air-hole arrangement region was a 0.5-mm square region. The conditions for the present calculation differ from those applied in the experiment shown in FIG. 14 in that only the hole density in the p-layer 111 was increased to $1 \times 10^{18}$ cm$^{-3}$ (the electron density $N_e$ in the n-layer 112 was maintained at $1 \times 10^{17}$ cm$^{-3}$; in other words, the carrier densities were the same as in the case of FIG. 15C), and in that the size of the air-hole arrangement region was decreased. The result of this calculation demonstrates that the upper limit of the frequency can be increased to approximately 70 MHz.

Next, using FIGS. 17A-17C, a thermal emission source 10B which has a smaller radius of the air holes 121 than the thermal emission source 10A in the previous embodiment is described. In the present example, the lattice constant a of the triangular lattice was 4.5 µm, and the radius r of the air holes 121 was 0.63 µm (0.14a). The other conditions were the same as applied to the thermal emission source 10A. FIGS. 17A and 17B are microscopic images of the obtained thermal emission source 10B, while FIG. 17C is a graph showing the result of a measurement in which the wavelength spectrum of the infrared radiation emitted in the thermal emission source was measured with the experimental system 20. The graph shows wavelength spectra for two cases in which the applied voltage was 2 V (at which the emission intensity was at the highest level) and 10 V (at which the emission intensity was at the lowest level), respectively. When the applied voltage was 2 V, the full width at half maximum (FWHM) of the wavelength spectrum of the infrared radiation emitted from the thermal emission source 10B was 7.0 cm$^{-1}$ and narrower than 12.5 cm$^{-1}$ which is the FWHM of the spectrum in FIG. 11A achieved by the thermal emission source 10A when the applied voltage was 0 V. This means that a narrower emission spectrum was obtained by decreasing the diameter of the air holes. Furthermore, changing the voltage applied to the thermal emission source 10B from 2 V to 10 V significantly decreased the emission intensity. This confirms that an intensity modulation by the voltage control is similarly possible as with the thermal emission source 10A.

The present invention is not limited to the previous embodiment.

Although the p-layer 111, n-layer 112 and i-layer 113 in the previous embodiment are made of semiconductors using GaAs as the main constituent, other semiconductors may also be used. The quantum well structure layer 114 may also be made of a material other than the previously mentioned one. The quantum well structure layer 114 is not limited to one having n-type quantum wells; a quantum well structure layer having p-type quantum wells may also be used, such as a laminate structure composed of a number of InP layers and p-InGaAs layers alternately arranged in a laminate form. The quantum well structure layer 114 is also not limited to one having a multiple quantum well structure as in the previous embodiment; a quantum well structure in which only a single quantum well is formed may also be used. The thickness values of the p-layer 111, n-layer 112, i-layer 113 and quantum well structure layer 114 are not limited to the previously mentioned ones, which are mere examples. The hole density in the p-layer 111 and the electron density in the n-layer 112 (the densities of the impurities in those layers) are not limited to the previously mentioned values, which are also mere examples. The p-layer 111 and the quantum well structure layer 114 may be directly joined together without using the i-layer 113.

In the previous embodiment, air holes 121 are used as the modified refractive index areas. Alternatively, a tangible material whose refractive index differs from that of the slab 11 may be used for the modified refractive index areas. The shape and size of the modified refractive index areas (air holes 121) are not limited to those mentioned in the previous embodiment; as for the shape, they may have the shape of a triangular column, rectangular column or similar shape. The lattice constant and lattice pattern of the modified refractive index areas (air holes 121) are also not limited to those mentioned in the previous embodiment; as for the lattice pattern, a square lattice or other lattice patterns may also be used.

Figure 18A:
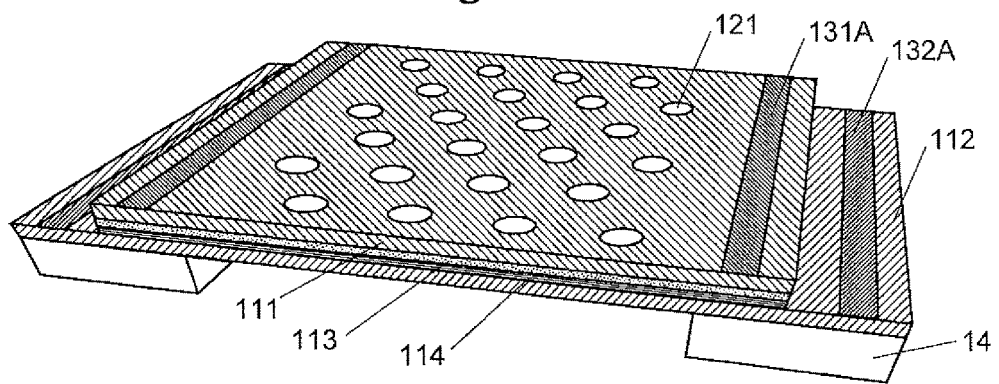
FIGS. 18A and 18B are a perspective view and top view of a modified example of the thermal emission source according to the present invention, respectively.
Figure 18B:
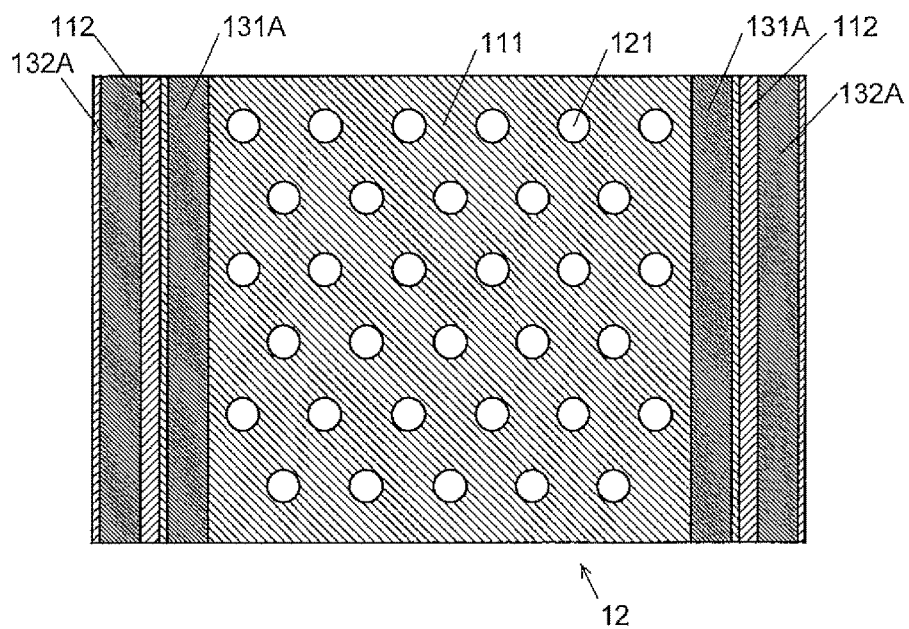

In the previous embodiment, the p-type electrode 131 is provided in such a manner as to surround the arrangement region where the air holes 121 are cyclically arranged. FIGS. 18A and 18B show another example, in which a pair of p-type electrodes 131A are provided on both sides of the arrangement region. Such a configuration also allows the light to be extracted from the arrangement region without being blocked by the p-type electrodes 131A. In FIGS. 18A and 18B, the n-type electrodes 132A are also in the form of a pair of strips similar to the p-type electrodes 131A, although it is not essential to give similar shapes to the p-type and n-type electrodes.

In the previous embodiment, thermal conduction from an external heat source is used to heat the thermal emission source. The heating method is not limited to this one. Electric power for the heating may be directly injected into the thermal emission source itself. Other heating means may also be used.

REFERENCE SIGNS LIST 10, 10A, 10B . . . Thermal Emission Source
11 . . . Slab
111 . . . p-Layer
112 . . . n-Layer
113 . . . i-Layer
114 . . . Quantum Well Structure Layer
12 . . . Two-Dimensional Photonic Crystal
121 . . . Air Hole
131, 131A . . . p-Type Electrode
132, 132A . . . n-Type Electrode
14 . . . Base
20 . . . Experimental System
21 . . . Heater
22 . . . Pulse Generator
23 . . . Detector
24 . . . Optical System
25 . . . Digital Oscilloscope

The invention claimed is:
1. A thermal emission source comprising:
 a) a two-dimensional photonic crystal including a slab, the slab including:

an n-layer made of an n-type semiconductor,
a quantum well structure layer having a quantum well structure, and
a p-layer made of a p-type semiconductor, the n-layer, the quantum well structure layer, and the p-layer being stacked in a mentioned order in a thickness direction,
wherein modified refractive index areas whose refractive index differs from refractive indices of the n-layer, the p-layer and the quantum well structure layer are cyclically arranged in the slab so as to resonate with a specific wavelength of light corresponding to a transition energy between subbands in a quantum well in the quantum well structure layer;

b) electrodes configured to apply, to the slab, a voltage which is negative on a side of the p-layer and positive on a side of the n-layer; and c) at least one base provided on the n-layer, the base configured to transfer heat from an external heat source to the two-dimensional photonic crystal.

2. The thermal emission source according to claim 1, wherein the quantum well structure layer has an n-type quantum well, and an i-layer made of an insulating material is provided between the quantum well structure layer and the p-layer.

3. The thermal emission source according to claim 1, wherein the quantum well structure layer has a p-type quantum well, and an i-layer made of an insulating material is provided between the quantum well structure layer and the n-layer.

4. The thermal emission source according to claim 1, wherein the two-dimensional photonic crystal has an electric resistance R and a capacitance C with which $1/(2\pi RC)$ becomes equal to or higher than a desired frequency.

5. The thermal emission source according to claim 1, wherein, among the p-layer and the n-layer, the layer having a larger effective mass of a carrier has a higher level of carrier density than the layer having a smaller effective mass of the carrier.

6. The thermal emission source according to claim 1, wherein the electrodes are:
a metallic p-electrode which is in contact with the p-layer and forms an ohmic junction with the p-type semiconductor constituting the p-layer; and
a metallic n-electrode which is in contact with the n-layer and forms an ohmic junction with the n-type semiconductor constituting the n-layer.

7. The thermal emission source according to claim 1, wherein the electrodes are provided on at least one of surfaces of the slab in such a manner that the electrodes surround an arrangement region where the modified refractive index areas are cyclically arranged.

8. A two-dimensional photonic crystal for use in a thermal emission source, the two-dimensional photonic crystal comprising:
a slab including an n-layer made of an n-type semiconductor, a quantum well structure layer having a quantum well structure, and a p-layer made of a p-type semiconductor, which are each stacked in a mentioned order in a thickness direction; and modified refractive index areas whose refractive index differs from refractive indices of the n-layer, the p-layer and the quantum well structure layer, the modified refractive index areas cyclically arranged in the slab so as to resonate with a specific wavelength of light corresponding to a transition energy between subbands in a quantum well in the quantum well structure layer,
wherein the two dimensional photonic crystal has an electric resistance R and a capacitance C with which $1/(2\pi RC)$ becomes equal to or higher than a desired frequency.

9. A thermal emission source comprising:
a) a two-dimensional photonic crystal including a slab, the slab including:
an n-layer made of an n-type semiconductor,
a quantum well structure layer having a quantum well structure, and
a p-layer made of a p-type semiconductor, the n-layer, the quantum well structure layer, and the p-layer being stacked in a mentioned order in a thickness direction,
wherein modified refractive index areas whose refractive index differs from refractive indices of the n-layer, the p-layer and the quantum well structure layer are cyclically arranged in the slab so as to resonate with a specific wavelength of light corresponding to a transition energy between subbands in a quantum well in the quantum well structure layer;

b) electrodes configured to apply, to the slab, a voltage which is negative on a side of the p-layer and positive on a side of the n-layer; and c) a thermal transfer portion configured to transfer heat from an outside of the thermal emission source to the two-dimensional photonic crystal.

10. A thermal emission source comprising:
a) a two-dimensional photonic crystal including a slab, the slab including:
an n-layer made of an n-type semiconductor,
a quantum well structure layer having a quantum well structure, and
a p-layer made of a p-type semiconductor, the n-layer, the quantum well structure layer, and the p-layer being stacked in a mentioned order in a thickness direction,
wherein modified refractive index areas whose refractive index differs from refractive indices of the n-layer, the p-layer and the quantum well structure layer are cyclically arranged in the slab so as to resonate with a specific wavelength of light corresponding to a transition energy between subbands in a quantum well in the quantum well structure layer;

b) electrodes configured to apply, to the slab, a voltage which is negative on a side of the p-layer and positive on a side of the n-layer;

c) a heating device configured to heat the two-dimensional photonic crystal by electric power; and d) a thermal transfer portion configured to transfer heat from the heating device to the two-dimensional photonic crystal.

\* \* \* \* \*